(12) United States Patent
James et al.

(10) Patent No.: US 6,518,663 B1
(45) Date of Patent: Feb. 11, 2003

(54) CONSTANT IMPEDANCE ROUTING FOR HIGH PERFORMANCE INTEGRATED CIRCUIT PACKAGING

(75) Inventors: Richard D. James, Plano, TX (US); Michael A. Lamson, Westminster, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/649,383

(22) Filed: Aug. 28, 2000

Related U.S. Application Data

(60) Provisional application No. 60/151,491, filed on Aug. 30, 1999.

(51) Int. Cl.[7] .......................... H01L 23/48; H01L 23/52; H01L 29/40; H05K 7/20; H05K 1/14
(52) U.S. Cl. .................. 257/734; 257/775; 257/691; 257/690; 257/693; 257/692; 257/698; 257/662; 257/786; 361/704; 361/748; 174/255; 174/250
(58) Field of Search .................. 257/691, 662, 257/690, 692, 693, 694, 698, 734, 737, 738, 778, 668, 666, 775; 361/704, 748; 174/255, 250

(56) References Cited

U.S. PATENT DOCUMENTS

| | | | | |
|---|---|---|---|---|
| 4,675,625 A | * | 6/1987 | Johnston ..................... 333/161 |
| 4,785,135 A | * | 11/1988 | Ecker et al. .................... 174/34 |
| 5,216,278 A | * | 6/1993 | Lin et al. ..................... 257/737 |
| 5,519,176 A | * | 5/1996 | Goodman et al. ........... 174/255 |
| 5,686,764 A | * | 11/1997 | Fulcher ....................... 257/691 |
| 5,764,489 A | * | 6/1998 | Leigh et al. ................. 257/786 |
| 5,952,726 A | * | 9/1999 | Liang .......................... 257/778 |
| 6,064,113 A | * | 5/2000 | Kirkman ...................... 257/691 |
| 6,084,777 A | * | 7/2000 | Kalidas et al. .............. 257/707 |
| 6,091,140 A | * | 7/2000 | Toh et al. .................... 257/691 |
| 6,107,578 A | * | 8/2000 | Hashim ....................... 174/250 |
| 6,160,705 A | * | 12/2000 | Stearns et al. ............... 257/737 |
| 6,194,786 B1 | * | 2/2001 | Orcutt ......................... 257/737 |
| 6,218,631 B1 | * | 4/2001 | Hetzel et al. ................ 174/261 |
| 6,249,047 B1 | * | 6/2001 | Corsis ......................... 257/691 |

* cited by examiner

*Primary Examiner*—Alexander O. Williams
(74) *Attorney, Agent, or Firm*—Michael K. Skrehot; Wade James Brady III; Frederick J. Telecky, Jr.

(57) ABSTRACT

An electrical connection web, operable at high frequency and configured on a dielectric substrate, comprising a plurality of generally parallel signal lines having graduated width and variable spacings, and said widths and spacings cooperatively selected such that the characteristic impedance of said signal lines is approximately the same for each line of said plurality and approximately constant over the length of each said signal line, whereby signal integrity for each said line is enhanced and cross talk between said lines is reduced.

7 Claims, 2 Drawing Sheets

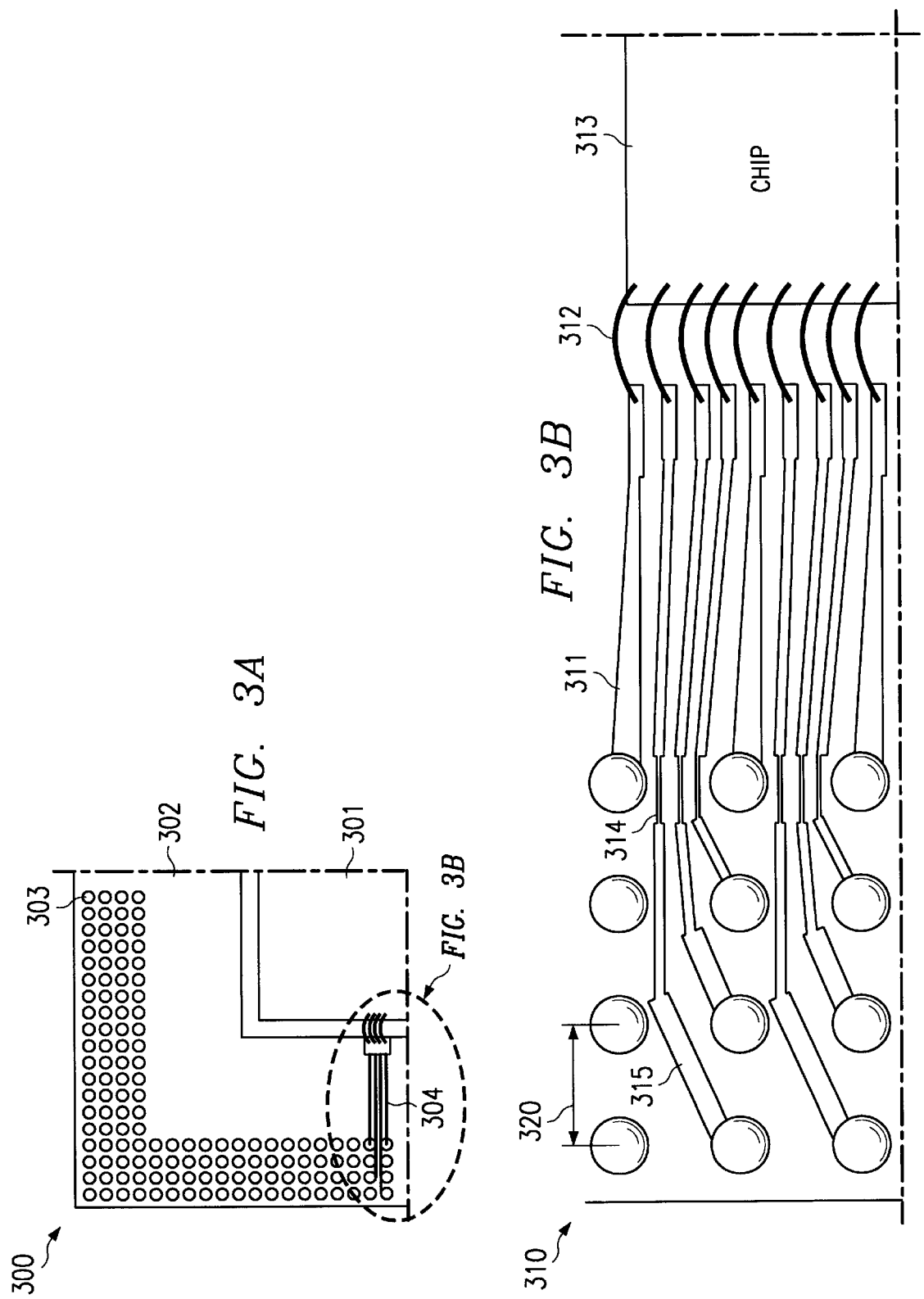

CONSTANT IMPEDANCE ROUTING FOR HIGH PERFORMANCE INTEGRATED CIRCUIT PACKAGING

This application claims the benefit of Provisional Application No. 60/151,491 filed Aug. 30, 1999.

FIELD OF THE INVENTION

The present invention is related in general to the field of semiconductor devices and processes and more specifically to structure and materials of high-performance plastic ball-grid array packages designed for integrated circuit assembly.

DESCRIPTION OF THE RELATED ART

Ball Grid Array (BGA) packages have emerged as an excellent packaging solution for integrated circuit (IC) chips with high input/output (I/O) count. BGA packages use sturdy solder balls for surface mount connection to the "outside world" (typically plastic circuit boards, PCB) rather sensitive package leads, as in Quad Flat Packs (QFP), Small Outline Packages (SOP), or Tape Carrier Packages (TCP). Some BGA advantages include ease of assembly, use of surface mount process, low failure rate in PCB attach, economic use of board area, and robustness under environmental stress. The latter used to be true only for ceramic BGA packages, but has been validated in the last few years even for plastic BGAs. From the standpoint of high quality and reliability in PCB attach, BGA packages lend themselves much more readily to a six-sigma failure rate fabrication strategy than conventional devices with leads to be soldered.

A BGA package generally includes an IC chip, a multi-layer substrate, and a heat spreader. The chip is generally mounted on the heat spreader using a thermally conductive adhesive, such as an epoxy. The heat spreader provides a low resistance thermal path to dissipate thermal energy, and is thus essential for improved thermal performance during device operation, necessary for consistently good electrical performance. Further, the heat spreader provides structural and mechanical support by acting as a stiffener, adding rigidity to the BGA package, and may thus be referred to as a heat spreader/stiffener.

One of the substrate layers includes a signal "plane" that provides various signal lines, which can be coupled, on one end, to a corresponding chip bond pad using a wire bond (or to a contact pad using flip-chip solder connection). On the other end, the signal lines are coupled with solder "balls" to other circuitry, generally through a PCB. These solder balls form the array referred to in a BGA. Additionally, a ground plane will generally be included on one of the substrate layers to serve as an active ground plane to improve overall device performance by lowering the inductance, providing controlled impedance, and reducing cross talk. These features become the more important the higher the BGA pin count is.

In contrast to the advantages of the BGA packages, prevailing solutions in BGA packages have lagged in performance characteristics such as power dissipation and the ability to maintain signal integrity in high speed operation necessary for devices such as high speed digital signal processors (DSP) and mixed signal products (MSP). Electrical performance requirements are driving the need to use multi-layer copper-laminated resin substrates (previously ceramic). As clock frequencies and current levels increase in semiconductor devices, the packaging designs are challenged to provide acceptable signal transmission and stable power and ground supplies. Providing stable power is usually achieved by using multiple planes in the package, properly coupled to one another and to the signal traces. In many devices, independent power sources are needed for core operation and for output buffer supply but with a common ground source.

As for higher speeds, flip chip assembly rather than wire bonding has been introduced. Compared to wire bonding within the same package outline, flip chip assembly offers greatly reduced IR drop to the silicon core circuits; significant reduction of power and ground inductances; moderate improvement of signal inductance; moderate difference in peak noise; and moderate reduction in pulse width degradation.

In order to satisfy all these electrical and thermal performance requirements, packages having up to eight metal layers have been introduced. The need, however, of high numbers of layers is contrary to the strong market emphasis on total semiconductor device package cost reduction. This emphasis is driving an ongoing search for simplifications in structure and materials, of course with the constraint that electrical, thermal and mechanical performances should be affected only minimally In U.S. patent application Ser. No. 60/147,596, filed Aug. 6, 1999, to which this invention is related, the structure and fabrication method of a high-performance, high I/O plastic BGA has been discussed. There are only two metal layers, one of which is exclusively devoted to a ground plane. The package has thus a small thickness and a low cost. But the remaining metal layer has a crowded routing density, since all signal and power lines of the high I/O device have to share this one layer. Consequently, the Vcc inductances are too high for fast-speed processor devices. The high inductance is the source of unacceptable electrical noise and cross talk, severely limiting device speed.

The signal lines in today's semiconductor package substrates suffer in their electrical performance (for instance, signal integrity and cross talk) because their characteristic impedance is not constant due to the fact that the lines have to be routed with non-uniform spacings to neighboring lines in the crowded line layout.

An urgent need has therefore arisen to break this vicious cycle and conceive a concept for a low-cost, yet high performance electrical connection on dielectric substrates, especially in BGA package structures. Preferably, this structure should be based on a fundamental design concept flexible enough to be applied for different semiconductor product families and a wide spectrum of design and assembly variations. It should not only meet high electrical and thermal performance requirements, but should also achieve improvements towards the goals of enhanced process yields and device reliability. Preferably, these innovations should be accomplished using the installed equipment base so that no investment in new manufacturing machines is needed.

SUMMARY OF THE INVENTION

According to the present invention, an electrical connection web is provided, operable at high frequency and configured on a dielectric substrate, comprising a plurality of generally parallel signal lines having graduated width and variable spacings, and said widths and spacings cooperatively selected such that the characteristic impedance of said signal lines is approximately the same for each line of said plurality and approximately constant over the length of each said signal line, whereby signal integrity for each said line is enhanced and cross talk between said lines is reduced.

According to electromagnetic theory, the impedance Z of an ac current of circular frequency ω is expressed by the relation $$Z=(R^2+X^2)E^{1/2}.$$

In this equation, the resistance R relates to the Ohmic resistance as modified by the high-frequency skin effect, and the reactance X relates to the inductance ωL and the capacitance 1/ωC as follows:

$$X=\omega L-1/\omega C.$$

With increasing frequency ω, the contribution to the reactance X and the impedance Z by the inductance L is increasing, while the contribution by the capacitance C is decreasing.

The phase difference between current and voltage is usually denoted as ψ. The following relations hold:

$$\sin \psi=-X/Z;$$

$$\cos \psi=R/Z;$$

$$tg\psi=-X/R.$$

For two impedances Z1 (having resistance R1, reactance X1, and phase difference ψ1) and Z2 (having resistance R2, reactance X2, and phase difference ψ2) in series, the total impedance Ztotal is $$Ztotal=[Z1^2+Z2^2+2Z1Z2 \cos(\psi 1-\psi 2)]E^{1/2}.$$

For two impedances Z1 and Z2 in parallel, the total impedance Ztotal is $$1/Ztotal=[1/Z1^2+1/Z2^2+2/(Z1Z2)\cos(\psi 1-\psi 2)]E^{1/2}.$$

For designing signal lines in an IC package, it is useful to consider an individual line as being composed of several segments of uniform width and orientation. The impedance Zself of an individual line is then the sum of the segmental impedances in series.

Furthermore, it is useful to consider a plurality of lines as being composed of lines dependent on adjacent neighbors. The impedance Zmutual of the plurality is then the sum of the line impedances in parallel.

The characteristic impedance Ztotal of the signal lines in the package is then the sum of Zself and Zmutual:

$$Ztotal=Zself+Zmutual. \text{ (vector addition)}$$

The package is commonly to be designed for a specific value of Ztotal. A signal travelling along a signal line would suffer distortions whenever the characteristic impedance Ztotal would not stay constant due to changes of either Zself and/or Zmutual.

The basic mathematics for calculating impedances for a layout of a plurality of conductors can be found in the paper by A. E. Ruehli, "Inductance Calculations in a Complex Integrated Circuit Environment", IBM J. Res. Develop. Vol. 16, pp. 470–481 (1972). It is advantageous to obtain the solutions of the equations by a computer program.

In the calculation of the inductance of a conductor relative to a plane at ground potential, the relative geometry has to be considered. In this calculation, the inductance is expressed inversely proportional to the width, or area, of the conductor; consequently, the inductance can be reduced by increasing the area of the conductor.

It is an aspect of the present invention to keep Ztotal constant by compensating any change of Zself through a counteracting change of Zmutual, and any change of Zmutual through a counteracting change of Zself.

These counteracting changes are provided by cooperatively selecting widths and spacings of signal lines, thereby modifying the Ohmic and capacitive contributions to Zself and Zmutual with the goal of keeping the characteristic impedance approximately constant.

Another aspect of the invention is to provide a methodology to lower the inductance of the signal lines relative to the electrical ground potential by increasing the area of the line.

Another aspect of the invention is to utilize existing semiconductor fabrication processes and to reach the electrical device goals without the cost of equipment changes and new capital investment, by using the installed fabrication equipment.

Another aspect of the invention is to provide design and fabrication solutions such that they are flexible enough to be applied for different semiconductor high-performance device families and a wide spectrum of high speed, high power design and assembly variations.

These aspects have been achieved by the electrical design of the signal lines on dielectric substrates for high-speed semiconductor devices. In particular, the design according to the invention has been applied for the layout of high-speed signal lines on multi-layer substrates in high I/O ball grid array packages for high-performance integrated circuits.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 3A is a schematic and simplified top view of a portion of a plurality of signal lines on a ball grid array package substrate.

FIG. 3B is a top view of a portion of a plurality of signal lines on a ball grid array package substrate, representing a magnified view of a portion of FIG. 3A and substantially drawn to scale.

DETAILED DESCRIPTION OF THE PREFERRED EMBODIMENTS

Figure 1:
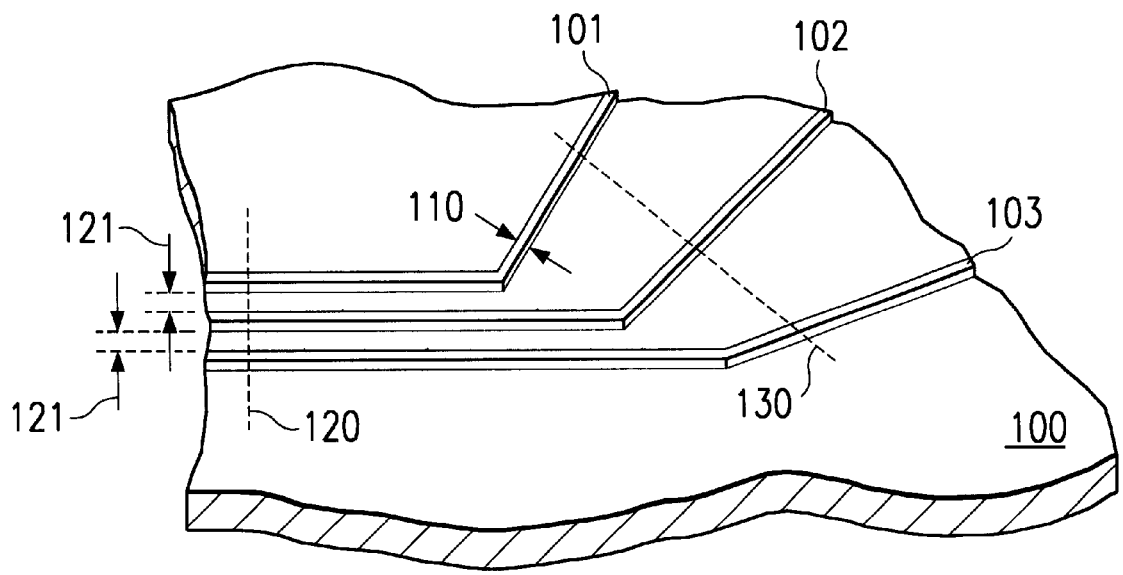
FIG. 1 is a schematic perspective view of a portion of high-speed signal lines as employed in the layout on dielectric substrates for semiconductor packages.

FIG. 1 illustrates a dielectric substrate 100 having a plurality of electrically conductive signal lines 101, 102, and 103 deposited or imbedded. Only a small portion of the signal lines is actually shown in FIG. 1. The lines are routed with uniform width 110. Consequently, the self-impedance of these lines is constant over the length of uniform width.

As the check mark 120 shows, there are regions within the plurality of signal lines where the spacings 121 of one line to other neighboring lines is uniform; in these regions, the signal lines run parallel. Consequently, the mutual impedance from one line to the other is constant, and furthermore, the characteristic impedance of the signal lines within this check mark region 120 is constant. This result is based on the relation quoted above that the characteristic impedance is the (vector) sum of the self impedance and the mutual impedance, both being a function of Ohmic, capacitance and inductance contributions.

As the check mark 130 shows, there are other regions within the plurality of signal lines where the spacings of one line to other neighboring lines are not uniform. The spacings are "variable" with regard to location (however not with regard to time). Consequently, the mutual impedance from one line to the other is not constant but locally variable, and furthermore, the characteristic impedance of the signal lines within this check mark region 130 is not constant. Again, this result is based on the relation quoted above that the characteristic impedance is the (vector) sum of the self impedance and the mutual impedance, both being a function of Ohmic, capacitance and inductance contributions.

The fact of locally variable impedance has deleterious consequences for the integrity of high frequency signals travelling along signal lines, and thus for line cross talk, electrical noise and ultimately device speed. The solution according to the present invention is illustrated in FIG. 2.

In regions of variable line spacings, and thus variable mutual impedances, the self-impedance is modified such that the (vector) sum of mutual impedance and self-impedance remains approximately constant.

Figure 2:
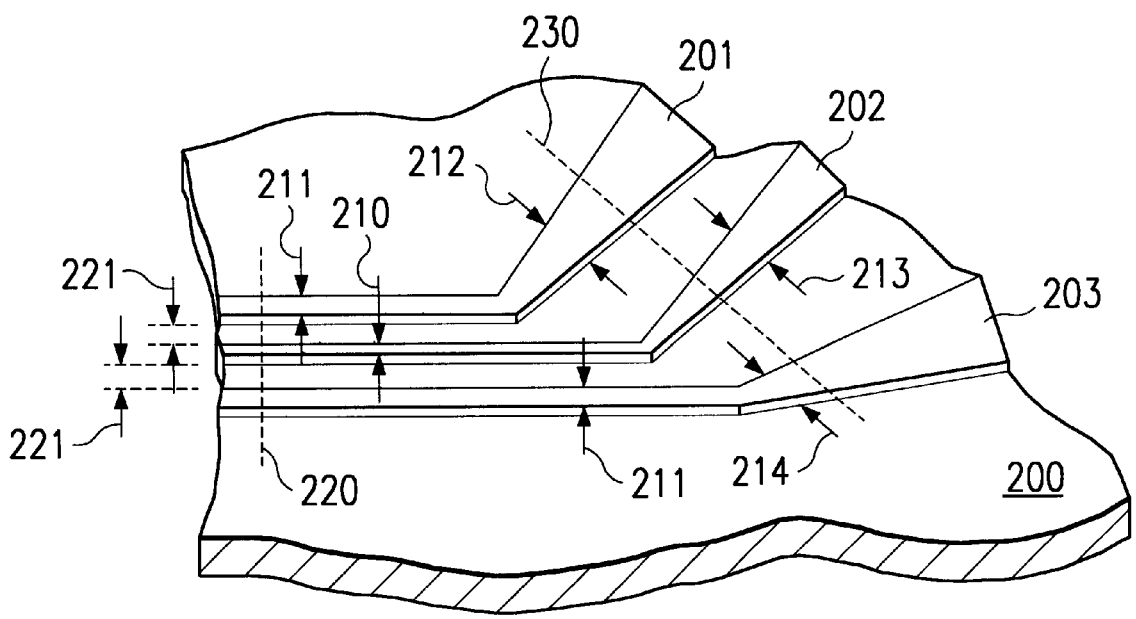
FIG. 2 is a schematic perspective view of a portion of high-speed signal lines on dielectric substrates for semiconductor packages, as modified by using the concepts of the present invention.

FIG. 2 illustrates a dielectric substrate 200 having a plurality of electrically conductive signal lines 201, 202, and 203 deposited or imbedded. Only a small portion of the signal lines is actually shown in FIG. 2. The lines are routed having regions of uniform widths 210 or 211, and other regions of "graduated" widths 212, 213, and 214. As defined herein, the term "graduated" is used to describe locally variable change, both smooth and abrupt, and specifically refers to the geometrical width of electrical conductors as a function of position.

As a consequence of the graduated line width, the self-impedance of each line is not constant, but rather locally variable over the length of non-uniform line width.

As the check mark 220 shows, there are regions within the plurality of signal lines where the spacings 221 of one line to other neighboring lines is uniform; in these regions, the signal lines run parallel. Consequently, the mutual impedance from one line to the other is constant, and furthermore, the characteristic impedance of the signal lines within this check mark region 220 is constant. This result is based on the relation quoted above that the characteristic impedance is the (vector) sum of the self impedance and the mutual impedance.

As the check mark 230 shows, there are other regions within the plurality of signal lines where the spacings of one line to other neighboring lines are not uniform. The spacings are variable with regard to location. Consequently, the mutual impedance from one line to the other is not constant but locally variable, and furthermore, the characteristic impedance of the signal lines within this check mark region 230 is not constant.

A indicated by FIG. 2, it is an important feature of the present invention to compensate the local variations of the mutual impedance by counteracting changes of the self-impedance. At any selected check mark, for example 230, the width of each signal line, and consequently the self-impedance of each signal line, is varied such that it (at least approximately) compensates for the change of the mutual impedance and thus keeps the characteristic line impedance (at least approximately) constant.

By way of example, if an IC design calls for a characteristic impedance of 60Ω, the invention provides the method of achieving this value in signal line regions with parallel line layout as well as in regions of divergent line layout by graduating the width of each line as required. Diminishing mutual impedance is replaced by increasing self-impedance.

The methodology of the invention also allows the inverse approach: The characteristic impedance can be kept constant by compensating any change of the self-impedance through a counteracting change of the mutual impedance. Variable line spacing is designed in cooperation with graduated line width.

The methodology of the invention further allows a compensating approach within the region of parallel line layout, when the widths 210 and 211 of signal lines are not identical (see FIG. 2). In this case, the line spacings 221 can be modified to achieve predetermined characteristic impedance values.

For packages having a plane at electrical ground potential in proximity to the signal and power lines, the methodology of the invention can be employed to reduce the inductance of each signal line. As mentioned above, the inductance is inversely proportional to the area, or width, of a conductor, and therefore can be reduced by increasing the width of the conductor. FIG. 2 shows examples of wider signal line widths and strongly graduated line widths. For these increased line areas, the inductance is reduced, and thus the characteristic impedance. Consequently, the high-frequency performance of the package, especially the operational speed, can be improved.

The methodology can be applied to the signal layout of any dielectric substrate; examples are generally printed circuit boards and assembly motherboards, and for semiconductor devices, the substrates of ball grid array packages. In the latter example, the substrate typically consists of an insulating layer with two surfaces. The first patterned metal layer is attached to one of its surfaces, intended to provide electrical ground potential, and the second patterned metal layer is attached to its other surface, intended so provide signal and power lines.

According to the invention, this second metal layer has a plurality of signal lines with graduated widths and variable spacings in order to keep the characteristic impedance of each signal line approximately the same for each line and approximately constant over the length of each signal line. Further, the inductance of these signal lines relative to the ground potential layer is minimized. As a consequence, signal integrity is enhanced for each line, cross talk between the lines and the overall package noise is reduced, and package speed is improved.

The integrated circuit chip may be attached to the substrate by an adhesive and electrically connected by bonding wires, or it may be flip-attached using solder bumps. Finally, the substrate is electrically connected to other devices using solder balls attached to the substrate, or simple clamping mechanisms.

FIG. 3 is substantially drawn to scale, however simplified. It illustrates a quadrant, generally designated 300, of a ball grid array package with chip 301 attached to substrate 302. The array of solder balls 303 forms the endpoints of signal lines; only few signal lines are shown; power lines are not shown. The enlargement, generally designated 310, depicts the plurality of signal lines 311, connected by wire bonding 312 to chip 313. The signal lines are shown to scale (determined by solder ball pitch 320), having variable spacings and graduated widths so that they are designed with constant impedance routing. Each section of self-impedance and mutual impedance is calculated using the equations recited above so that the characteristic (total) impedance is constant. By way of example, notice the reduced line widths 314 in regions of high mutual impedance, or the increased line widths 315 in regions of low mutual impedance.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the package may be a BGA package or any other semiconductor device package. As another example, the signal (and power) lines may be deposited on the substrate, or may be imbedded in the substrate surface; various metals or other electrically conductive materials may be used. It is therefore intended that the appended claims encompass any such modifications or embodiments.

We claim:

1. An electrical connection web, operable at high frequency and configured on a dielectric substrate, comprising:

a plurality of generally parallel signal lines having graduated width and variable spacings, and said widths and spacings cooperatively selected to compensate for changes in self-impedance by causing a counteracting mutual impedance, such that the characteristic impedance of said signal lines is approximately the same for each line of said plurality and approximately constant over the length of each said signal line, whereby signal integrity for each said line is enhanced and cross talk between said lines is reduced.

2. The web according to claim 1 wherein said dielectric substrate is a printed circuit board.

3. The web according to claim 1 wherein said dielectric substrate is a portion of an integrated circuit package.

4. A high-performance integrated circuit package substrate comprising:

a plurality of signal lines, each having a geometrical configuration consisting of at least one first segment of uniform width and at least one second segment of graduated width, each segment contributing to the self-impedance of said line, and each said line contributing to the characteristic impedance of said plurality;

each said signal line geometrically positioned relative to its adjacent lines such that said first line segment is spaced uniformly relative to said first elements of said adjacent lines, contributing constant mutual impedance to the characteristic impedance;

each said signal line further geometrically positioned relative to its adjacent lines such that said second segment is spaced variably relative to said second segments of said adjacent lines, contributing variable mutual impedances to the characteristic impedance; and said graduated line width and said variable geometrical position cooperatively selected to compensate for changes in self-impedance by causing a counteracting mutual impedance, for each said signal line such that the characteristic impedance is approximately constant over the length of each said signal line and approximately the same for each line of said plurality, whereby signal integrity for each said line is enhanced and cross talk between said lines is reduced.

5. The substrate according to claim 4 wherein said integrated circuit package is a ball-grid array package.

6. A high-performance integrated circuit package having a substrate including a ground plane and a signal-and-power plane, comprising:

a plurality of signal lines in said signal-and-power plane, each line having a geometrical configuration consisting of at least one first segment of uniform width and at least one second segment of graduated width, each segment contributing to the inductance of said line relative to said ground plane; and said second segment configured for reducing said inductance of each said line, whereby the characteristic impedance of each line is reduced and the performance of said package is enhanced.

7. A high-performance, high I/O integrated circuit assembled in a ball grid array package, comprising:

a substrate having an insulating layer with two surfaces and a patterned metal layer attached to each said surface;

one of said metal layers providing electrical ground potential, the other of said metal layers providing signal and power lines;

said signal lines having graduated widths and variable spacings configured such that the characteristic impedance of said signal lines is approximately the same for each said line, and the inductance of said lines relative to said ground potential layer is minimized, whereby signal integrity is improved and package noise and cross talk reduced;

an integrated circuit chip attached to said substrate; and solder balls attached to said substrate.

\* \* \* \* \*